United States Patent
Onodera et al.

(10) Patent No.: US 11,101,161 B2
(45) Date of Patent: Aug. 24, 2021

(54) SUBSTRATE HOLDING MEMBER

(71) Applicant: NGK SPARK PLUG CO., LTD., Nagoya (JP)

(72) Inventors: Norio Onodera, Tomiya (JP); Takashi Teshima, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 399 days.

(21) Appl. No.: 16/013,340

(22) Filed: Jun. 20, 2018

(65) Prior Publication Data

US 2018/0374739 A1    Dec. 27, 2018

(30) Foreign Application Priority Data

Jun. 26, 2017 (JP) .............................. JP2017-124440
Mar. 28, 2018 (JP) .............................. JP2018-062113

(51) Int. Cl.
*H01L 21/683* (2006.01)
*H01L 21/687* (2006.01)

(52) U.S. Cl.
CPC ...... *H01L 21/6838* (2013.01); *H01L 21/6875* (2013.01); *H01L 21/68728* (2013.01); *H01L 21/68757* (2013.01)

(58) Field of Classification Search
CPC ........... H01L 21/6838; H01L 21/68728; H01L 21/68757; H01L 21/6875; C23C 16/4583
See application file for complete search history.

(56) References Cited

U.S. PATENT DOCUMENTS 10,468,289 B2 * 11/2019 Ishino ................. H01L 21/6838
2007/0285647 A1 * 12/2007 Kwan ............... H01L 21/68757
29/428

(Continued)

FOREIGN PATENT DOCUMENTS

| CN | 102308379 A | 1/2012 |
| JP | 2005-310933 A | 11/2005 |
| JP | 2009-054723 A | 3/2009 |

(Continued)

OTHER PUBLICATIONS

Taiwan Intellectual Property Office, Office Action issued in corresponding Application No. 107121428, dated Jul. 2, 2019. (English translation not available.).

(Continued)

*Primary Examiner* — Lee D Wilson
*Assistant Examiner* — Seahee Hong
(74) *Attorney, Agent, or Firm* — Stites & Harbison, PLLC; Jeffrey A. Haeberlin; James R. Hayne

(57) ABSTRACT

A substrate holding member includes a base, and a plurality of convex parts formed at an upper surface of the base and configured to hold a substrate at top surfaces thereof. Each convex part has a root portion extending from the upper surface of the base, and a top portion formed on the root portion and including the top surface. In each convex part, a cross-sectional area of the root portion is larger than a cross-sectional area of the top portion. At least a portion including the top surface of the top portion is formed of a holding member made of a material having a greater Young's modulus than a material forming the base. The respective holding members are spaced apart from each other.

4 Claims, 4 Drawing Sheets

(56) References Cited

U.S. PATENT DOCUMENTS

2012/0193878 A1    8/2012  Suzuki et al.
2015/0311108 A1  10/2015  Horiuchi

FOREIGN PATENT DOCUMENTS

| JP | 2011-199303 A | 10/2011 |
| JP | 5063797 B2 | 10/2012 |
| JP | 6001675 B2 | 9/2016 |

OTHER PUBLICATIONS

Korean Intellectual Property Office, Office Action (Notification of Reason for Refusal) issued in corresponding Application No. 10-2018-0070320, dated Jul. 22, 2020.

\* cited by examiner

BASE SIDE

HOLDING MEMBER SIDE

SUBSTRATE HOLDING MEMBER

CROSS REFERENCE TO RELATED APPLICATION

The present application claims priority to Japanese Patent Application No. 2017-124440 which was filed on Jun. 26, 2017 and Japanese Patent Application No. 2018-062113 which was filed on Mar. 28, 2018, the disclosures of which are herein incorporated by reference in their entireties.

BACKGROUND OF THE INVENTION

Field of the Invention

The present invention relates to a substrate holding member, and particularly to a substrate holding member such as a vacuum chuck for holding a substrate such as a wafer.

Description of Related Art

In a semiconductor manufacturing apparatus, a substrate holding member is used as a member for holding a substrate such as a wafer. In the substrate holding member, a plurality of convex parts are formed at a surface of a base, and a wafer is held at top surfaces (tip surfaces) of the convex parts.

In order to minimize the contact area between each convex part and the substrate, the area of the top surface of the convex part needs to be reduced. Meanwhile, in order to perform vacuum suction of the substrate, each convex part needs to have a certain height. Therefore, each convex part is formed into a slender cylindrical shape.

It is proposed to form a coating film on the tip of each slender cylindrical convex part (refer to Patent Document 1). It is also proposed to form a coating film (protection film) over the entire surface of the base (base body) including the convex parts (projecting portions). In this case, the coating film advantageously prevents falling of particles from the base (refer to Patent Document 2).

RELATED ART DOCUMENT

Patent Document 1 is Japanese Patent No. 6001675.
Patent Document 2 is Japanese Patent No. 5063797.

BRIEF SUMMARY OF THE INVENTION

However, when the convex part has the slender cylindrical shape as described in Patent Document 1, breakage of the convex part may occur due to a sliding force that repeatedly acts on the contact face between the convex part and the base, which makes it difficult to hold the substrate with a satisfactory flatness over a long term.

Meanwhile, when the protection film is formed over the entire surface of the base as described in Patent Document 2, a difference in physical properties between the base and the protection film may cause peeling or cracking between the base and the protection film during long-term use. It is considered that such peeling or cracking is caused by the fact that the base and the protection film are slightly different in physical properties such as linear expansion coefficient, modulus of elasticity, density, hardness, crystallinity, etc., and stress occurs due to a difference in expansion coefficient along with temperature change, or stress occurs when suction and removal of a wafer is performed. Such stress is propagated into the base under the protection film, and causes peeling or cracking. Such peeling or cracking of the protection film may cause generation of particles, which makes it difficult to hold the substrate with a satisfactory flatness over a long term.

The present invention has been made in view of the aforementioned conventional drawbacks, and an object of the present invention is to provide a substrate holding member capable of holding a substrate with a satisfactory flatness over a long term.

A substrate holding member according to the present invention includes a base having an upper surface, and a plurality of convex parts formed at the upper surface of the base and configured to hold a substrate at top surfaces thereof. Each of the plurality of convex parts has a root portion extending from the upper surface of the base, and a top portion formed on (i.e., positioned on) the root portion and including the top surface. In each of the plurality of convex parts, a cross-sectional area of the root portion in a horizontal direction along the upper surface of the base is larger than a cross-sectional area of the top portion in the horizontal direction. In each of the plurality of convex parts, at least a portion including the top surface of the top portion is formed of a holding member made of a material having a greater Young's modulus than a material forming the base. In other words, in each of the plurality of convex parts, a holding member includes at least a portion including the top surface of the top portion, and the holding member includes a material having a greater Young's modulus than a material forming the base. The respective holding members forming the plurality of convex parts are spaced apart from each other.

According to the substrate holding member of the present invention, at least a portion of the convex part including the top surface to be in contact with the substrate is formed of the holding member made of a material having a greater Young's modulus than the material forming the base. Thus, as compared with the case where the convex part is made of the same material as the base, abrasion resistance at the top surface in contact with the substrate is improved, and generation of particles from the top surface can be inhibited.

The cross-sectional area of the root portion of each convex part is larger than the cross-sectional area of the top portion. Therefore, as compared with the convex part (projection) having the same cross-sectional area throughout, which is described in Patent Document 1, higher rigidity of the convex part can be achieved even if the area of the top surface is the same as that of Patent Document 1.

Since the respective holding members are spaced apart from each other, peeling, cracking, and the like of the holding member can be inhibited as compared with the case where the holding member (coating) is formed over the entire surface of the base (base body), which is described in Patent Document 2.

Consequently, the substrate can be held with a satisfactory flatness over a long term.

In the substrate holding member of the present invention, each of the plurality of convex parts preferably includes: a first convex part that forms the root portion extending from the upper surface of the base (i.e., the root portion of the convex part), and has an upper end surface; and a second convex part that is formed on (i.e., positioned on) a portion of the upper end surface of the first convex part, and forms (i.e., comprises) the top portion. The holding member preferably forms (i.e., includes) at least a portion of the second convex part.

In this case, since the first convex part extends from the upper surface of the base, the first convex part and the base can be integrally formed. Thus, adhesion between the first convex part and the base can be improved, thereby inhibiting occurrence of breakage such as peeling or cracking between the first convex part and the base.

In the substrate holding member of the present invention, the holding member preferably forms the second convex part and an upper-end top portion including at least the upper end surface of the first convex part. In other words, the holding member preferably includes the second convex part and an upper-end top portion of the first convex part, with the upper-end top portion including at least the upper end surface of the first convex part.

In this case, since the holding member forms the second convex part and the upper-end top portion of the first convex part, these parts can be integrally formed. Thus, adhesion between the first convex part and the second convex part can be improved, thereby inhibiting occurrence of breakage such as peeling or cracking between these parts.

Further, since the holding member forms the upper-end top portion of the first convex part, the holding member and the lower portion of the first convex part adhere to each other in a wide area. Therefore, adhesion therebetween can be improved, thereby inhibiting occurrence of breakage such as peeling or cracking between the holding member and the lower portion of the first convex part.

In the substrate holding member of the present invention, it is preferable that each of the plurality of convex parts includes a portion that is formed continuously from the base and is made of a material forming the base, a recess is formed at the portion made of the material forming the base, and the holding member is formed in at least the recess. In other words, it is preferable that each of the plurality of convex parts includes a portion formed continuously with the base and comprises the material forming the base, the portion formed continuously with the base defines a recess, and the recess receives at least a portion of the holding member.

In this case, the recess is formed at the portion, of the convex part, made of the material forming the base, and the holding member is formed in this recess, thereby inhibiting peeling of the holding member from the portion, of the convex part, made of the material forming the base.

In the substrate holding member of the present invention, the holding member preferably forms the entirety of each of the plurality of convex parts.

In this case, since the holding member forms the entirety of the convex part, it is not necessary to form a portion continuous from the base, as a portion of the convex part. Therefore, the process of forming this portion is omitted, thereby simplifying the manufacturing process.

In another implementation of the substrate holding member of the present invention, it is preferable that a recess is formed at the upper surface of the base (i.e., the upper surface of the base defines a recess), and the holding member is formed in at least the recess. In other words, in this implementation the recess receives at least a portion of the holding member.

In this case, the recess is formed at the upper surface of the base, and the holding member is formed in the recess, thereby inhibiting peeling of the holding member from the base.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A substrate holding member 1 according to a first embodiment of the present invention will be described with reference to the drawings.

Figure 1:
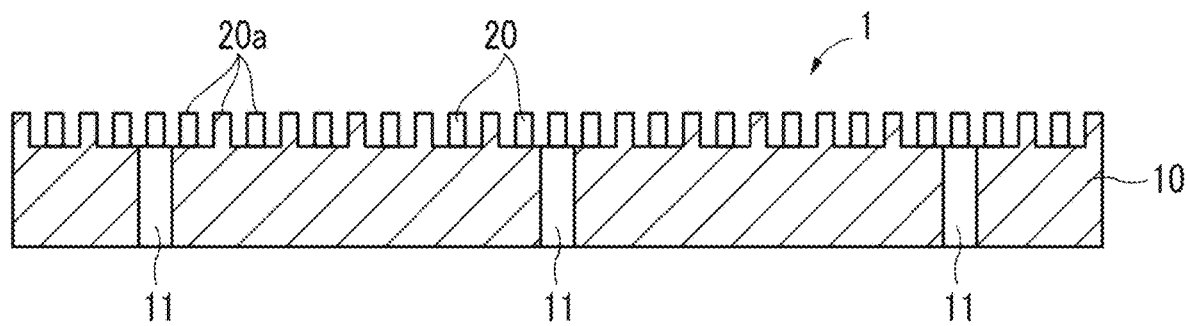
FIG. 1 is a schematic cross-sectional view of a substrate holding member according to a first embodiment of the present invention.

As shown in a cross-sectional view of FIG. 1, the substrate holding member 1 includes: a disk-shaped base 10; and a plurality of convex parts (projecting portions, pins) 20 which are formed on an upper surface of the base 10, and hold a wafer (substrate), which is not shown, at top surfaces 20a thereof.

Figure 2:
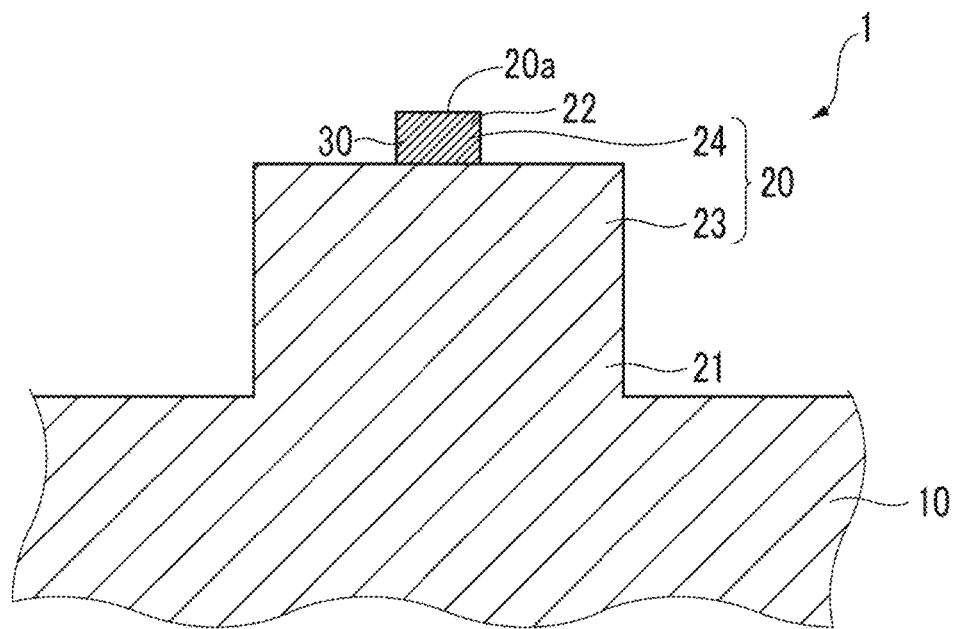
FIG. 2 is an enlarged vertical cross-sectional view schematically showing a convex part of the substrate holding member according to the first embodiment of the present invention.

In the substrate holding member 1, as shown in a partially enlarged cross-sectional view of FIG. 2, each convex part 20 has: a root portion 21 extending from the upper surface of the base 10; and a top portion 22 formed on the root portion 21 and including the top surface 20a. In the convex part 20, a cross-sectional area S1 of the root portion 21 in a horizontal direction (right-left direction in FIG. 2) along the upper surface of the base 10 is larger than a cross-sectional area S2 of the top portion 22 in the horizontal direction.

At least a portion, of the convex part 20, including the top surface 20a of the top portion 22 is composed of a holding member 30 which is made of a material having a larger Young's modulus than a material forming the base 10. At least the portion including the top surface 20a of the top portion 22 is preferably made of a material having a lower porosity (less pores) than the material forming the base 10. The respective holding members 30 are spaced apart from each other.

In the present embodiment, the convex part 20 is composed of: a cylindrical lower part 23; and a cylindrical upper part 24 which projects upward from the lower part 23 and has a smaller diameter than the lower part 23. The lower part 23 is formed integrally with the base 10 so as to project from the surface of the base 10, and is made of the same material as the base 10. That is, the lower part 23 is formed continuously from the base 10.

The entirety of the upper part 24 is composed of the holding member 30. Thus, the root portion 21 of the convex part 20 is a root portion (lower end portion) of the lower part 23, and the top portion 22 of the convex part 20 is a top portion (upper end portion) of the upper part 24.

The top surface 20a of the convex part 20, which is an upper end surface of the holding member 30, is formed to be flat. The lower part 23 and the upper part 24 correspond to a first convex part and a second convex part of the present invention, respectively.

The height of the lower part 23 is preferably 0.15 to 0.35 mm, and is, for example, 0.25 mm. The diameter of the lower part 23 is preferably 1.0 to 1.5 mm, and is, for example, 1.25 mm. The height of the upper part 24 is preferably 0.02 to 0.06 mm, and is, for example, 0.02 mm. The diameter of the upper part 24 is preferably 0.02 to 0.2 mm, and is, for example, 0.02 mm.

In FIGS. 1 and 2, the base 10, the convex part 20, the holding member 30, and the like are exaggerated without taking into account the actual shapes and dimensional ratios thereof, and therefore, do not necessarily coincide with the actual shapes and dimensional ratios. The same applies to FIG. 4 to FIG. 8 described later.

Although it has been described that both the lower part 23 and the upper part 24 are cylindrical in shape, these portions 23 and 24 are not strictly cylindrical in shape because the edges may be curved, projections and depressions may be formed at the side surfaces, or the side surfaces may be inclined depending on a manufacturing method or the like.

As for the material of the base 10 and the lower part 23, silicon carbide (SiC), alumina ($Al_2O_3$), or the like may be used. Since it is preferable that the material is highly rigid and conductive to prevent circuit destruction due to static electricity, a sintered silicon carbide (SiC) body is preferably used. Since the pores of the base 10 and the lower part 23 may cause particle dust or the like, the number of the pores is preferably smaller, and the porosity is not higher than 5%, preferably not greater than 2%.

From the standpoint of strength, the pore diameter of the base 10 and the lower part 23 is preferably smaller, and the average pore diameter of the base 10 and the lower part 23 is 1 to 5 μm. The average pore diameter may be obtained as follows. A cross section of the base 10 and the lower part 23 which are magnified 2000 times by using a scanning electron microscope (SEM) is photographed, and the average pore diameter is calculated for an arbitrary area of 30 μm square in the obtained cross-sectional micrograph by using an intercept method.

The Young's modulus (modulus of longitudinal elasticity) of the base 10 and the lower part 23 is 400 to 440 GPa, and preferably 420 to 440 GPa. The Vickers hardness of the base 10 and the lower part 23 is 22 to 26 GPa (under a load of 0.5 kgf).

As for the material of the holding member 30, silicon carbide (SiC), alumina ($Al_2O_3$), or the like may be used. Since the material preferably contains the same principal component as that of the base 10 and the lower part 23, a silicon carbide material is preferable. The number of the pores of the holding member 30 is preferably smaller than that of the base 10 and the lower part 23 because the holding member 30 includes a portion to be in direct contact with the substrate such as a wafer. The porosity of the holding member 30 is lower than that of the base 10 and the lower part 23, and is not greater than 1%, preferably not greater than 0.5%. The Young's modulus of the holding member 30 is greater than that of the base 10 and the lower part 23, and is 450 to 480 GPa, preferably 460 to 480 GPa. The Young's moduli of the holding member 30, the base 10, and the lower part 23 can be measured based on ISO 14577 which is a test method using nano-indentation. The Vickers' hardness of the holding member 30 is 28 to 31 GPa (under a load of 0.5 kgf).

In the case where the material of the base 10 and the lower part 23 is a sintered silicon carbide body, the material of the holding member 30 is preferably a silicon carbide material formed by thermal CVD (Chemical Vapor Deposition). The reason is as follows. According to the thermal CVD, the holding member 30 has very few pores, and pores are not observed in SEM observation on a cross section of the holding member 30 which is magnified 2000 times, which means that the porosity of the holding member 30 is substantially 0%. Therefore, the porosity and the Young's modulus can be easily set within the aforementioned ranges, and the thickness of the holding member 30 can be easily increased to about 1 mm.

Figure 3:
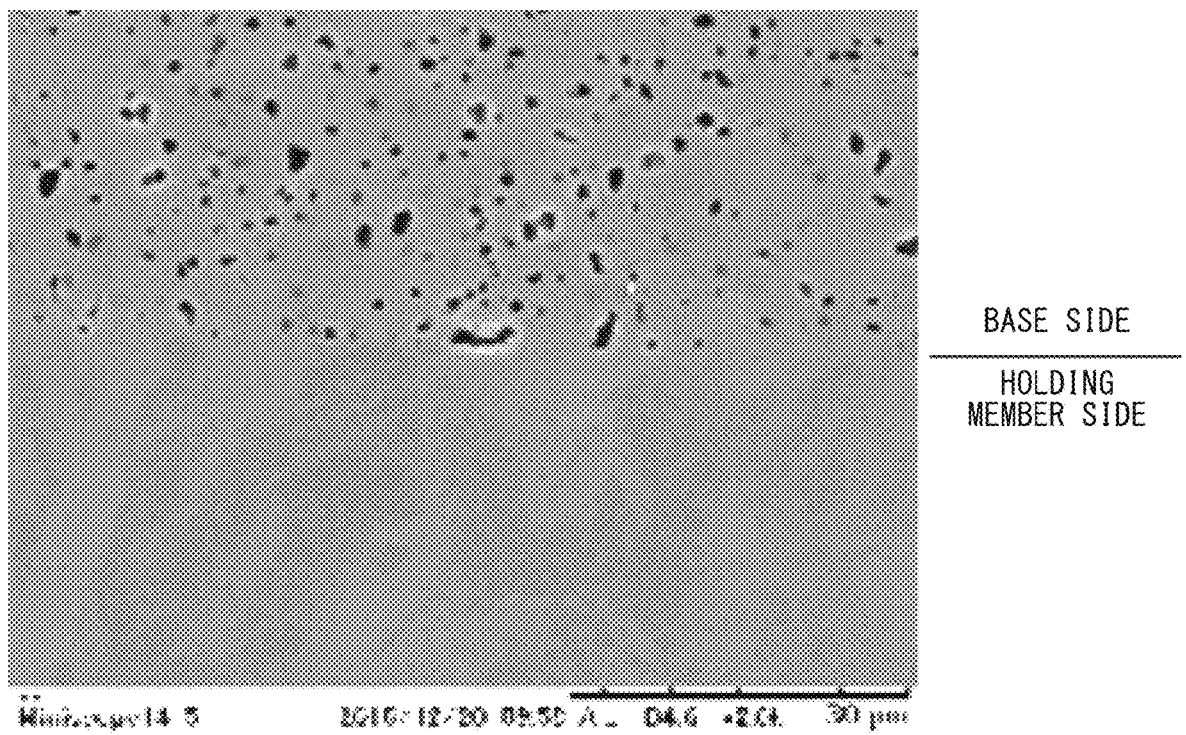
FIG. 3 is a micrograph showing an enlarged cross section of the convex part of the substrate holding member according to the first embodiment of the present invention.

FIG. 3 shows a micrograph of an enlarged cross section of a portion in which the holding member 30 made of SiC is formed by thermal CVD on the lower part 23 obtained by normal-pressure sintering of SiC to which $B_4C$ and C are added as sintering aids. The micrograph is obtained by using a scanning electron microscope (SEM). While a certain number of pores spread in the sintered silicon carbide body of the lower part 23, pores are not observed in the holding member 30 made of SiC formed by thermal CVD, which confirms that the porosity is substantially 0%. The number of the pores and the magnitude of the porosity in each of the holding member 30, the base 10, and the lower part 23 can be evaluated through observation, using the SEM, on the micrograph of the enlarged cross section.

Although the case where the lower part 23 and the upper part 24 each have a cylindrical shape has been described, these parts 23 and 24 may have any shape as long as the cross-sectional area S1 of the root portion 21 of the convex part is larger than the cross-sectional area S2 of the top portion 22 of the convex part. For example, the lower part 23 and the upper part 24 each may have a truncated cone shape, or the lower part 23 and the upper part 24 as a whole may have a single truncated cone shape. The lower part 23 and the upper part 24 each may have any shape besides the cylindrical shape, such as a rectangular column, a truncated cone, or a truncated pyramid, as long as the shape expands from the top toward the bottom. At least one of the upper part 24 and the lower part 23 may have a shape obtained by stacking a plurality of cylindrical shapes, truncated cone shapes, or the like in the up-down direction.

In the substrate holding member 1, a wafer is supported by the substrate holding member 1 so as to be in contact with the top surfaces 20a of the plurality of convex parts 20. Then, although not illustrated, when air in a space demarcated by the substrate holding member 1 and the wafer is sucked by a vacuum suction device such as a vacuum pump (not shown) connected to vacuum suction paths 11 formed in the base 10, the wafer is suction-held on the substrate holding member 1 by the suction force.

Figure 4:
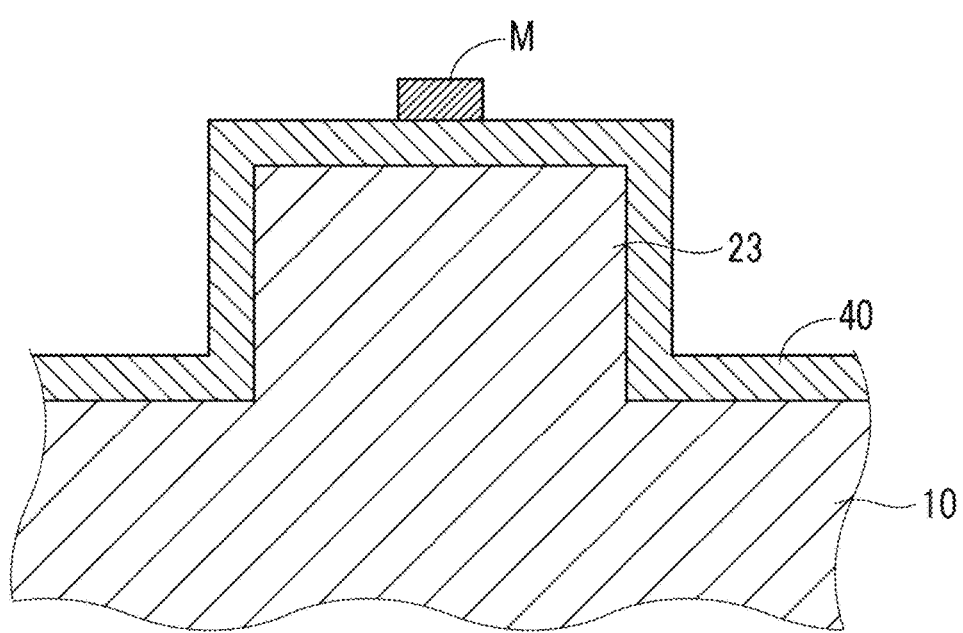
FIG. 4 is an enlarged vertical cross-sectional view schematically showing a manufacturing process for the substrate holding member according to the first embodiment of the present invention, in which a holding layer is formed on a surface of a base and a mask is disposed on an area of the holding layer.

Next, a method for manufacturing the substrate holding member 1 will be described with reference to FIG. 4.

First, a substantially disk-shaped molded body made of silicon carbide is prepared, and this molded body is sintered at 1900° C. to 2100° C. in an Ar gas atmosphere, thereby producing a substantially disk-shaped sintered silicon carbide body. A carbon-containing substance such as $B_4C$ or C may be added as a sintering aid to the powder material of silicon carbide.

Next, the upper surface of the sintered silicon carbide body is subjected to grinding, blasting, electric discharge machining, rubbing, high energy beam (e.g., laser beam) irradiation, or the like, thereby forming the lower parts 23 of the plurality of convex parts 20.

Furthermore, for example, a holding layer 40 made of silicon carbide is formed by thermal CVD, plasma CVD, ion plating, or the like so as to cover the entire upper surface of the base 10 including the surfaces of the lower parts 23. The holding layer 40 is preferably formed by thermal CVD, but may be formed by plasma CVD, ion plating, or the like as long as the porosity and the Young's modulus of the holding layer 40 can be set within the aforementioned ranges for the holding member 30. Thus formed holding layer 40 covers the entire surface including the upper surface of the base 10 and the surfaces of the lower parts 23.

Next, a mask M is placed so as to cover a region of portions to be the upper parts 24, and a region other than the region covered with the mask M is subjected to blasting or the like to remove the holding layer 40. The holding layer 40 may be removed by grinding, electric discharge machining, rubbing, high energy beam (e.g., laser beam) irradiation, or the like. Thus, portions of the holding layer 40 to be the upper parts 24 remain, thereby forming the holding members 30. Further, the top surfaces of the holding members 30 are subjected to polishing so as to make at least the top surfaces of the convex parts 20 flat.

According to the substrate holding member 1 described above, at least a portion of each convex part 20 including the top surface 20a to be in contact with the wafer is composed of the holding member 30 which is made of a material having a lower porosity (less pores) and a greater Young's modulus than the material forming the base 10. Thus, as compared with the case where the convex part 20 is made of the same material as the base 10, abrasion resistance at the top surface 20a in contact with the wafer is improved, and generation of particles from the top surface 20a can be inhibited.

The cross-sectional area S1 of the root portion 21 of the convex part 20 is larger than the cross-sectional area S2 of the top portion 22 of the convex part 20. Therefore, as compared with the slender cylindrical convex part (projection) having the same cross-sectional area throughout, which is described in Patent Document 1, higher rigidity of the convex part 20 can be achieved even if the area of the top surface 20a is the same as that of Patent Document 1.

Since the respective holding members 30 are spaced apart from each other, peeling, cracking, and the like of the holding member 30 can be inhibited, as compared with the case described in Patent Document 2 where the holding member (coating) is formed over the entire surface of the base (base body).

Consequently, the wafer can be held with a satisfactory flatness over a long term.

Since the lower part 23 extends from the upper surface of the base 10, the lower part 23 and the base 10 can be integrally formed. Thus, adhesion between the lower part 23 and the base 10 can be improved, thereby inhibiting occurrence of breakage such as peeling or cracking between the lower part 23 and the base 10.

Figure 5:
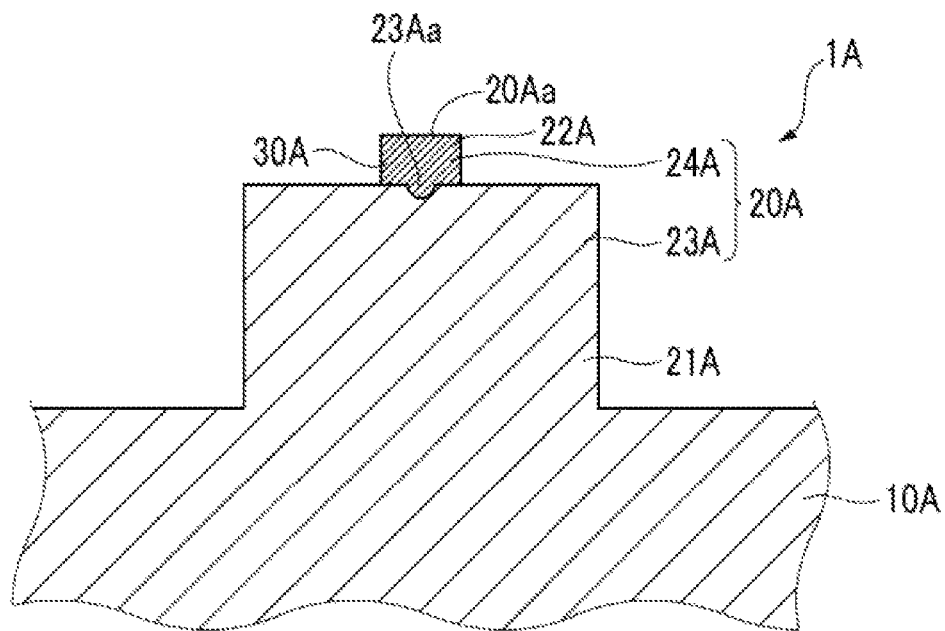
FIG. 5 is an enlarged vertical cross-sectional view schematically showing a convex part of a substrate holding member according to a second embodiment of the present invention.

Next, a substrate holding member 1A according a second embodiment of the present invention will be described with reference to the drawing. As shown in FIG. 5, the substrate holding member 1A is different from the aforementioned substrate holding member 1 only in that a holding member 30A is formed also in a recess 23Aa formed at an upper surface of a lower part 23A.

Thus, the holding member 30A is formed in such a shape that a portion thereof formed in the recess 23Aa of the lower part 23A and the entirety of an upper part 24A are integrated with each other. A cross-sectional shape of the recess 23Aa in the vertical direction is not particularly limited, and may be a semi-circle, a semi-ellipse, a rectangle, or the like, or may be such a shape that an inner portion thereof laterally expands as compared with an opening thereof. The recess 23Aa preferably has a depth of 0.01 to 0.2 mm, and an opening width of 0.02 to 0.2 mm.

The holding member 30A may be formed as follows. That is, after the lower part 23A has been formed, the lower part 23A is subjected to grinding, blasting, electric discharge machining, rubbing, high energy beam irradiation, or the like to form the recess 23Aa at the upper surface of the lower part 23A, followed by formation of the holding layer 40.

According to the substrate holding member 1A described above, like the aforementioned substrate holding member 1, the flatness of the wafer can be satisfactorily maintained over a long term.

The recess 23Aa is formed at the upper surface of the lower part 23A, of the convex part 20A, which is made of the material forming the base 10A, and the holding member 30A is formed in the recess 23Aa. Therefore, peeling of the holding member 30A from the lower part 23A can be inhibited.

Figure 6:
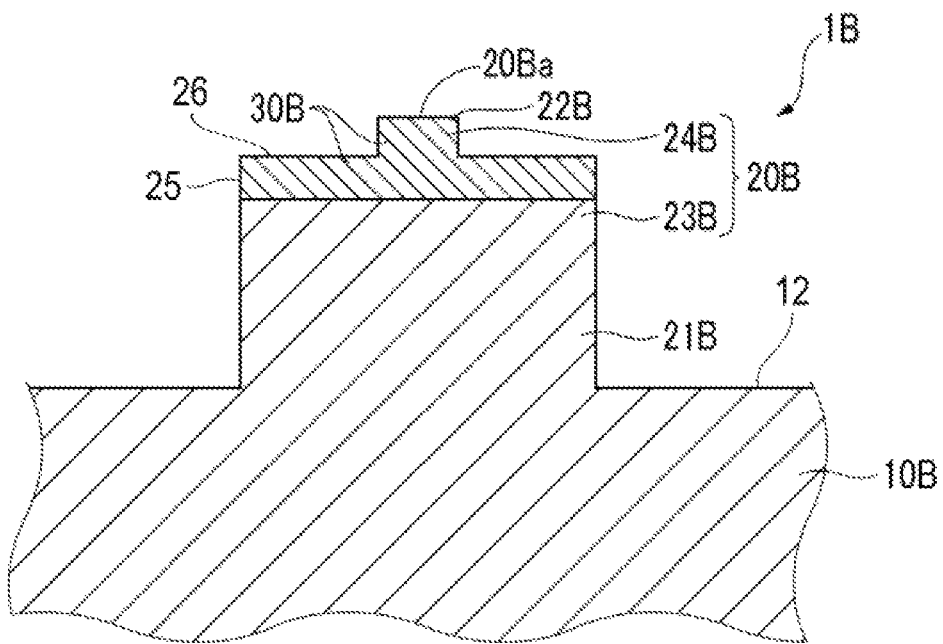
FIG. 6 is an enlarged vertical cross-sectional view schematically showing a convex part of a substrate holding member according to a third embodiment of the present invention.

Next, a substrate holding member 1B according to a third embodiment of the present invention will be described with reference to the drawing. As shown in FIG. 6, the substrate holding member 1B is different from the aforementioned substrate holding member 1 only in that an upper portion of a lower part 23B is made of the same material as an upper part 24B forming a portion of the holding member 30B.

Thus, the holding member 30B is formed in such a shape that the upper portion of the lower part 23B and the entirety of the upper part 24B are integrated with each other. A lower portion of the lower part 23B is formed continuously from the base 10. In other words, the lower portion of the lower part 23B extends from the upper surface 12 of the base 10. The thickness of the holding member 30B at the upper portion of the lower part 23B is preferably 0.01 to 0.2 mm.

According to the substrate holding member 1B described above, like the aforementioned substrate holding member 1, the wafer can be held with a satisfactory flatness over a long term.

An upper-end top portion 25 of the lower part 23B has an upper end surface 26 and the upper part 24B extends from the upper end surface 26 of the upper-end top portion 25 of the lower part 23B. Since the holding member 30B forms the upper part 24B and an upper-end top portion 25 of the lower part 23B, these parts can be integrally formed. Thus, adhesion between the lower part 23B and the upper part 24B can be improved, thereby inhibiting occurrence of breakage such as peeling or cracking between the lower part 23B and the upper part 24B.

Since the holding member 30B forms the upper-end top portion 25 of the lower part 23B, the holding member 30B and the lower portion of the lower part 23B adhere to each other in an area larger than the cross section of the upper part 24B. Therefore, adhesion therebetween can be improved, thereby inhibiting occurrence of breakage such as peeling or cracking between the holding member 30B and the lower part 23B.

Next, a substrate holding member 1C according to a fourth embodiment of the present invention will be described with reference to the drawing.

Figure 7:
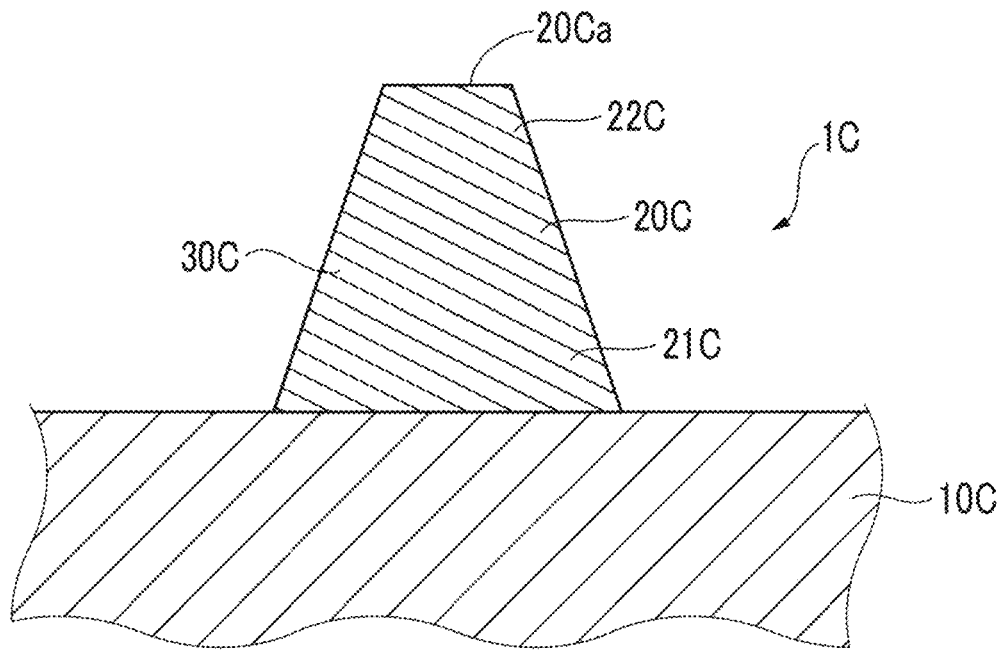
FIG. 7 is an enlarged vertical cross-sectional view schematically showing a convex part of a substrate holding member according to a fourth embodiment of the present invention.

As shown in FIG. 7, the substrate holding member 1C is different from the aforementioned substrate holding member 1 in that the entirety of a convex part 20C is formed of a holding member 30C. Unlike the convex part 20, the convex part 20C has a truncated cone shape as a whole. The convex part 20C may have any shape besides the truncated cone shape, such as a truncated pyramid, or a shape similar to a truncated cone and having a curved side surface swelling or bowing outward, as long as the shape expands from the top toward the bottom.

The height of the convex part 20C is preferably 0.15 to 0.35 mm, and is, for example, 0.25 mm. The diameter of a root portion 21C of the convex part 20C is preferably 0.2 to 1.5 mm, and is, for example, 0.25 mm. The diameter of a top portion 22C of the convex part 20C is preferably 0.02 to 0.2 mm, and is, for example, 0.05 mm.

In manufacturing the holding member 30C, since the lower part 23 need not be formed unlike manufacture of the substrate holding member 1 described above, the process of forming the lower part 23 can be omitted, thereby simplifying the manufacturing process.

The truncated-cone-shaped holding member 30C may be formed by depositing the holding layer 40 so as to cover the entire upper surface of the base 10C, and removing portions of the holding layer 40 other than portions to be the holding members 30C. It is particularly preferable that the removal of the holding layer 40 is performed by laser beam machining in which a flow of air does not occur. Machining such as blasting, in which a flow of powder occurs, causes a curved surface between the base 10C and a lower portion of the truncated-cone-shaped holding member 30C. However, laser beam machining can inhibit formation of such a curved surface.

According to the substrate holding member 1C described above, like the aforementioned substrate holding member 1, the wafer can be held with a satisfactory flatness over a long term.

Next, a substrate holding member 1D according to a fifth embodiment of the present invention will be described with reference to the drawing.

Figure 8:
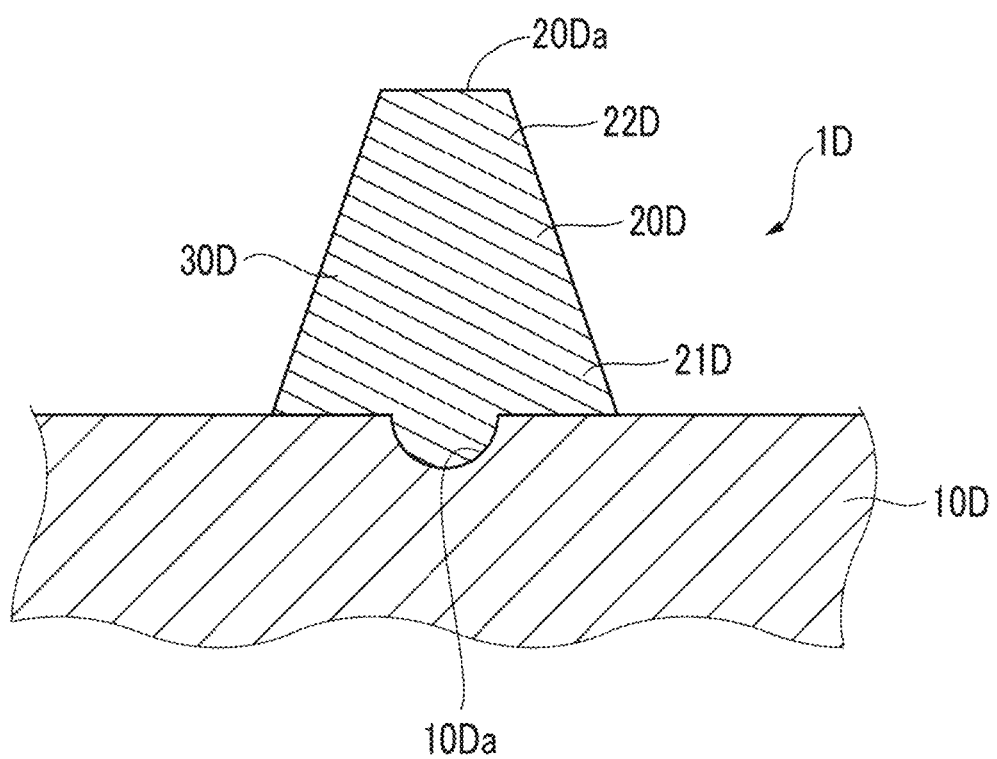
FIG. 8 is an enlarged vertical cross-sectional view schematically showing a convex part of a substrate holding member according to a fifth embodiment of the present invention.

As shown in FIG. 8, the substrate holding member 1D is different from the aforementioned substrate holding member 1C only in that a holding member 30D is also formed in a recess 10Da formed at the upper surface of a base 10D.

Thus, the holding member 30D is formed in such a shape that the convex part 20D and a portion thereof formed in the recess 10Da of the base 10D are integrated with each other. A cross-sectional shape of the recess 10Da in the vertical direction is not particularly limited, and may be a semi-circle, a semi-ellipse, a rectangle, or the like, or may be such as shape that an inner portion thereof laterally expands as compared with an opening thereof. The recess 10Da preferably has a depth of 0.01 to 0.2 mm, and an opening width of 0.02 to 0.2 mm.

The recess 10Da may be formed as follows. That is, after the base 10 having a flat upper surface has been formed, the base 10 is subjected to grinding, sand blasting, electric discharge machining, rubbing, high energy beam (e.g., laser beam) irradiation, or the like, thereby forming the recess 10Da at the upper surface of the base 10D.

According to the substrate holding member 1D described above, like the aforementioned substrate holding member 1, the wafer can be held with a satisfactory flatness over a long term.

Furthermore, since the holding member 30D is formed in the recess 10Da formed at the upper surface of the base 10D, peeling of the holding member 30D from the base 10D can be inhibited.

DESCRIPTION OF REFERENCE NUMERALS 1, 1A, 1B, 1C, 1D:• substrate holding member
10, 10A, 10B, 10C, 10D:• base
10Da:• recess
11:• vacuum suction path
20, 20A, 20B, 20C, 20D:• convex part
20a, 20Aa, 20Ba, 20Ca, 20Da:• top surface
21, 21A, 21B, 21C, 21D:• root portion
22, 22A, 22B, 22C, 22D:• top portion
23, 23A, 23B:• lower part (first convex part)
23Aa:• recess
24, 24A, 24B:• upper part (second convex part)
30, 30A, 30B, 30C, 30D:• holding member
40:• holding layer
M:• mask

What is claimed is:

1. A substrate holding member comprising:
    a base having an upper surface; and
    a plurality of convex parts positioned on the upper surface of the base, each of the plurality of convex parts including a root portion extending from the upper surface of the base and a top portion positioned on the root portion, each top portion including a top surface, the plurality of convex parts configured to hold a substrate at the top surfaces, wherein
    in each of the plurality of convex parts, a cross-sectional area of the root portion in a horizontal direction along the upper surface of the base is larger than a cross-sectional area of the top portion in the horizontal direction,
    in each of the plurality of convex parts, a holding member includes at least a portion including the top surface of the top portion, the holding member comprising a material having a greater Young's modulus than a material forming the base,
    a principal component of the material forming the holding member is silicon carbide such that a principal component of the material forming the top surface of the top portion is silicon carbide,
    a principal component of the material forming the base is silicon carbide, and
    the respective holding members of the plurality of convex parts are spaced apart from each other.

2. The substrate holding member according to claim 1, wherein
    each of the plurality of convex parts includes:
        a first convex part comprising the root portion and has an upper end surface; and
        a second convex part positioned on a portion of the upper end surface of the first convex part, and comprises the top portion, and
    the holding member includes at least a portion of the second convex part.

3. The substrate holding member according to claim 2, wherein the holding member includes the second convex part and an upper-end top portion of the first convex part, the upper-end top portion including at least the upper end surface of the first convex part.

4. The substrate holding member according to claim 1, wherein a principal component of the plurality of convex parts is the same as the principal component of the material forming the base.

* * * * *